(12) United States Patent
Carter et al.

(10) Patent No.: US 8,681,579 B2
(45) Date of Patent: Mar. 25, 2014

(54) PROGRAMMABLE CURRENT-LIMITED VOLTAGE BUFFER, INTEGRATED-CIRCUIT DEVICE AND METHOD FOR CURRENT-LIMITING A MEMORY ELEMENT

(75) Inventors: Richard J. Carter, Los Altos, CA (US); Muhammad Shakeel Qureshi, Santa Clara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/384,885

(22) PCT Filed: Apr. 30, 2010

(86) PCT No.: PCT/US2010/033306
§ 371 (c)(1),
(2), (4) Date: Jan. 19, 2012

(87) PCT Pub. No.: WO2012/091691
PCT Pub. Date: Jul. 5, 2012

(65) Prior Publication Data
US 2013/0070534 A1 Mar. 21, 2013

(51) Int. Cl.
*G11C 8/00* (2006.01)
(52) U.S. Cl.
USPC .................................. 365/230.06; 365/189.06
(58) Field of Classification Search
USPC ............................ 365/189.06, 189.07, 230.06
See application file for complete search history.

(56) References Cited

U.S. PATENT DOCUMENTS

| 5,949,731 | A * | 9/1999 | Tsukude | 365/230.01 |
|---|---|---|---|---|
| 6,038,183 | A * | 3/2000 | Tsukude | 365/201 |
| 7,340,356 | B2 | 3/2008 | Straznicky | |
| 7,593,249 | B2 | 9/2009 | Fasoli et al. | |
| 8,493,812 | B2 * | 7/2013 | Dengler et al. | 365/230.06 |
| 2006/0013037 | A1 | 1/2006 | Li et al. | |
| 2008/0089110 | A1 | 4/2008 | Robinett et al. | |
| 2008/0137401 | A1 | 6/2008 | Philipp et al. | |
| 2009/0003037 | A1 | 1/2009 | Symanczyk | |
| 2009/0244953 | A1 | 10/2009 | Maejima | |
| 2009/0323394 | A1 | 12/2009 | Scheuerlein | |

FOREIGN PATENT DOCUMENTS

WO WO-2009134291 11/2009

OTHER PUBLICATIONS

PCT Search Report, Apr. 30, 2010, PCT/US2010/033306, Filed Apr. 30, 2010.

* cited by examiner

*Primary Examiner* — Vanthu Nguyen

(57) ABSTRACT

A programmable current-limited voltage buffer. The programmable current-limited voltage buffer includes at least one current-bias circuit, an inverter, a write-current set control circuit, and an adaptive current limiter. The inverter is coupled to the current-bias circuit and a reference-voltage source, and is configured to couple a row line to either the current-bias circuit, or the reference-voltage source, in response to an input signal. The adaptive current limiter is coupled to the current-bias circuit and to the write-current set control circuit, and is configured to limit current flowing through the memory element in a write operation. An integrated circuit device is also provided, along with a method for current limiting a memory element during switching in an array of memory elements.

15 Claims, 10 Drawing Sheets

PROGRAMMABLE CURRENT-LIMITED VOLTAGE BUFFER, INTEGRATED-CIRCUIT DEVICE AND METHOD FOR CURRENT-LIMITING A MEMORY ELEMENT

STATEMENT OF GOVERNMENT INTEREST

This invention has been made with government support under Contract No. HR0011-09-3-0001, awarded by the Defense Advanced Research Project Agency. The government has certain rights in the invention.

TECHNICAL FIELD

Embodiments of the present invention relate generally to the field of memory elements, integrated-circuit (IC) devices including such memory elements, and methods for protecting a memory element during switching of the memory element from one state to another state.

BACKGROUND

The burgeoning growth of the information storage and processing industry creates ever increasing demands on the integrity and preservation of data stored and processed in information-processing systems. In particular, means for storing and processing information reliably in ICs and development of reliable electronic memories and programmable logic utilizing highly reliable electronic devices has taken on an increasingly more prominent role in satisfying these demands.

Scientists engaged in the research and development of high reliability electronic memories, such as random access memories (RAMs), and programmable logic, such as microprocessors, based on ICs are keenly interested in finding new means for storing and processing information in electronic devices having high reliability, such as ICs based on memristor technology. Thus, research scientists are actively pursuing new approaches for meeting these demands.

DESCRIPTION OF THE DRAWINGS

The accompanying drawings, which are incorporated in and form a part of this specification, illustrate embodiments of the technology and, together with the description, serve to explain the embodiments of the technology.

Figure 1:
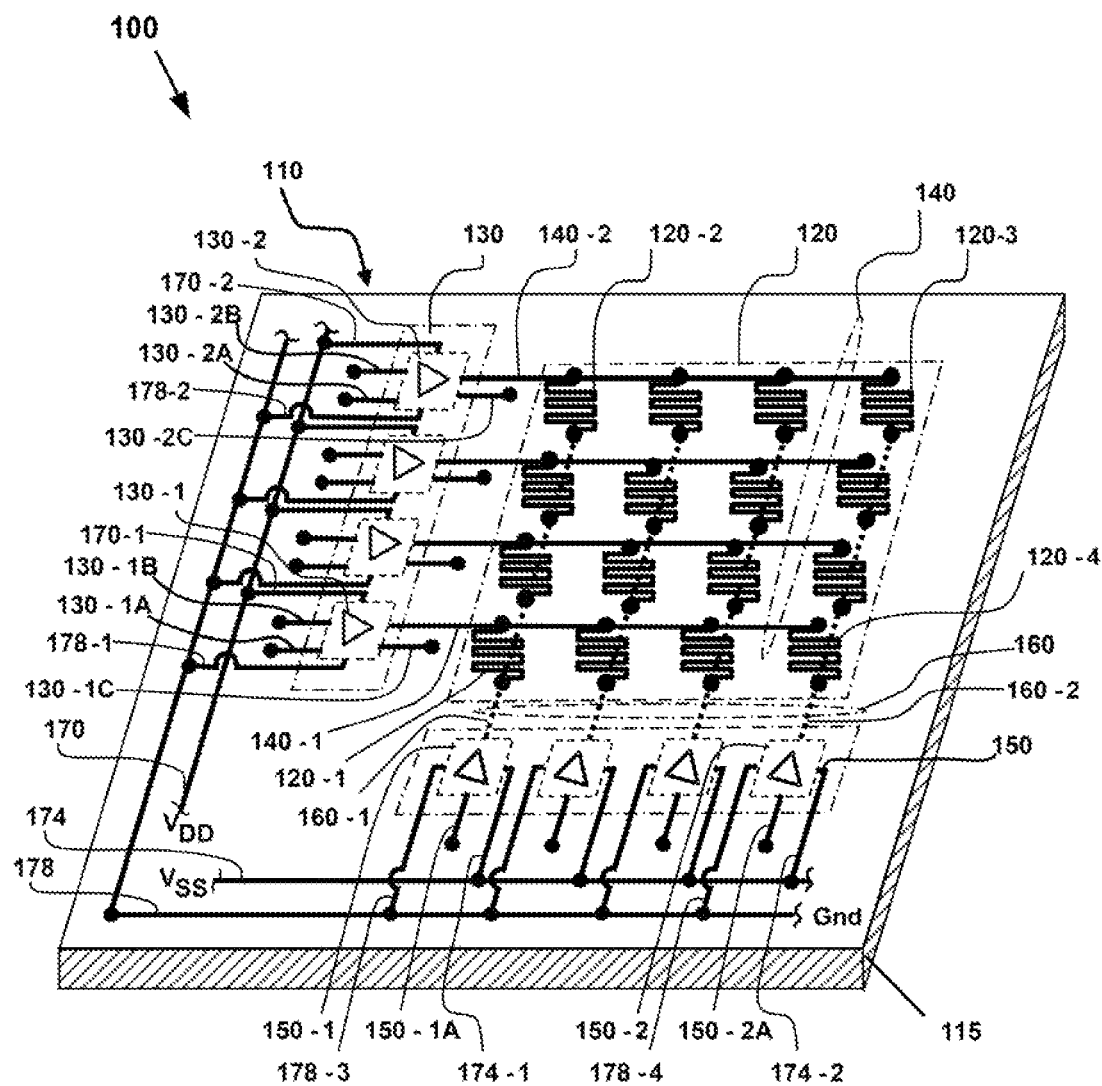
FIG. 1 is a perspective view of an integrated-circuit (IC) device including a memory element, for example, a memristor, in an array of memory elements illustrating an example environment in which a programmable current-limited voltage buffer is configured to protect the memory element during switching, in accordance with embodiments of the present invention.

The drawings referred to in this description should not be understood as being drawn to scale except if specifically noted.

DESCRIPTION OF EMBODIMENTS

Reference will now be made in detail to the alternative embodiments of the present invention. While the technology will be described in conjunction with the alternative embodiments, it will be understood that they are not intended to limit the technology to these embodiments. On the contrary, the technology is intended to cover alternatives, modifications and equivalents, which may be included within the spirit and scope of the technology as defined by the appended claims.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention. Throughout the drawings, like components are denoted by like reference numerals, and repetitive descriptions are omitted for clarity of explanation if not necessary.

Figure 2:
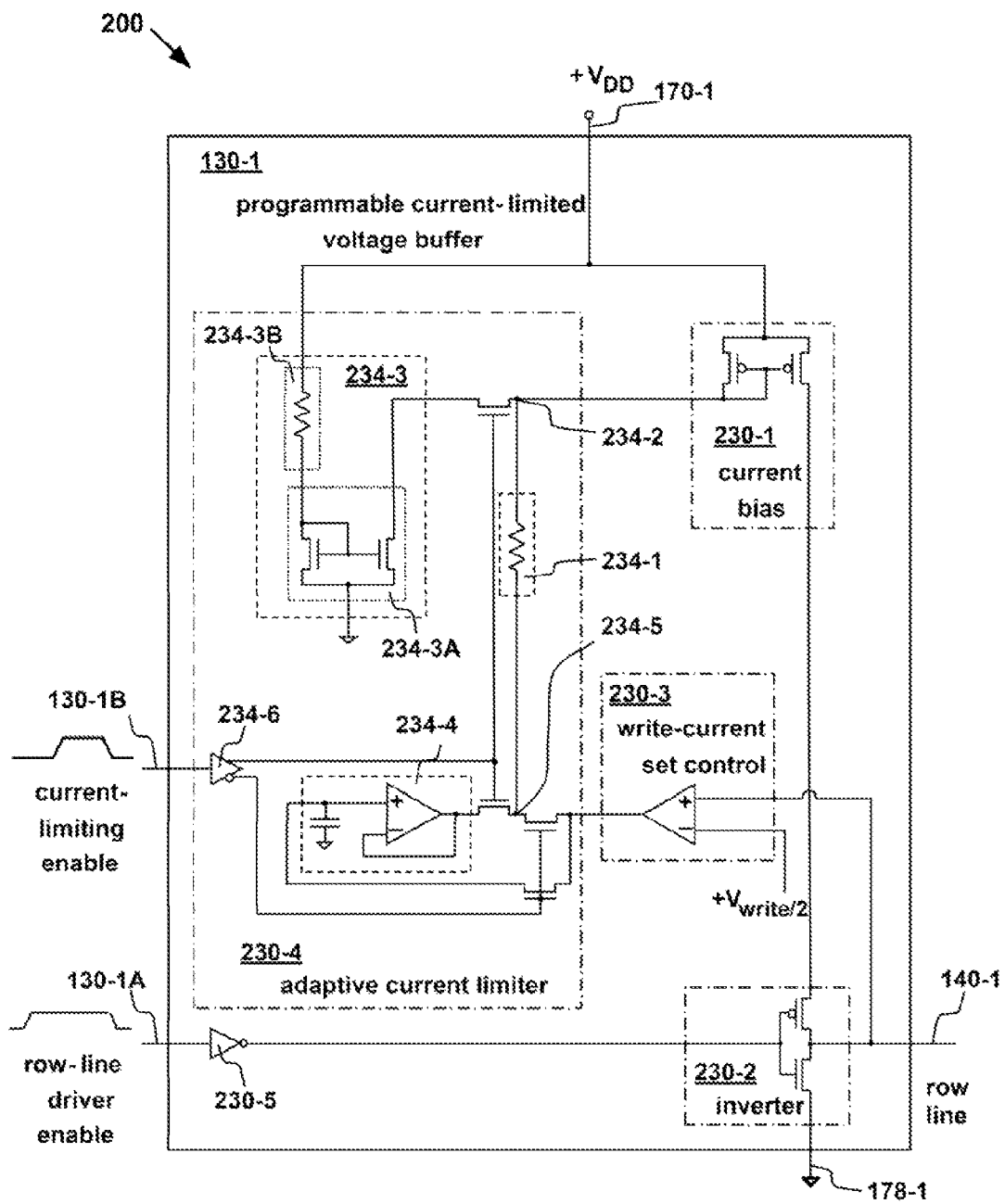
FIG. 2 is a block diagram of the programmable current-limited voltage buffer illustrating functional arrangement of circuit blocks in the programmable current-limited voltage buffer shown in FIG. 1, in accordance with embodiments of the present invention.

Embodiments of the present invention include a programmable current-limited voltage buffer 130-1 (see FIGS. 1 and 2). The programmable current-limited voltage buffer 130-1 includes at least one current-bias circuit 230-1, an inverter 230-2, a write-current set control circuit 230-3, and an adaptive current limiter 230-4. The current-bias circuit 230-1 is coupled to a first rail 170 of a power supply. The inverter 230-2 is coupled to the current-bias circuit 230-1 and a reference-voltage source 178, and is configured to couple a row line 140-1 of a memory element 120-1 to either the current-bias circuit 230-1, or the reference-voltage source 178, in response to an input signal. The adaptive current limiter 230-4 is coupled to the current-bias circuit 230-1 and to the write-current set control circuit 230-3, and is configured to limit current flowing through the memory element 120-1 in a write operation of the memory element 120-1. An integrated circuit device 110 including the programmable current-limited voltage buffer 130-1 and the memory element 120-1 in an array 120 of memory elements is also provided, along with a method for current limiting the memory element 120-1 during switching the memory element 120-1 in the array 120 of memory elements.

With reference now to FIG. 1, in accordance with embodiments of the present invention, a perspective view 100 is shown of an integrated-circuit (IC) device 110 including a memory element 120-1, for example, a memristor, in an array 120 of memory elements 120-1, 120-2, 120-3 and 120-4. FIG. 1 is also illustrative of an example environment in which a programmable current-limited voltage buffer 130-1 is configured to protect the memory element 120-1 during switching. The IC device 110 may include more than one programmable current-limited voltage buffer 130-1; for example, the IC device 110 may include an array 130 of programmable current-limited voltage buffers, of which programmable current-limited voltage buffers 130-1 and 130-2 are examples. Moreover, even though the array 120 of memory elements, for example, memory elements 120-1, 120-2, 120-3 and 120-4, which may include memristors, in the IC device 110 may be suggestive of a memory array, for example, as may be used in a random access memory (RAM), this is by way of example without limitation thereto, as embodiments of the present invention also include within their spirit and scope an array 120 of memory elements selected, from the group consisting of a logic array, and a memory array. However, embodiments of the present invention include arrays in which the memory elements are arranged in a "cross-bar" array, which is a term of art that refers to a plurality of memory elements arranged at the crossings of an array 140 of row lines, of which row lines 140-1 and 140-2 are examples, and an array 160 of column lines of which column lines 160-1 and 160-2 are examples. Moreover, as shown in FIG. 1, the memory elements are shown as resistive components that may include, in particular, memristors, phase-change memory cells, and other resistance-change memory cells, which are all within the spirit and scope of embodiments of the present invention. In addition, embodiments of the present invention also include within their spirit and scope other types of memory elements that may be susceptible to over-current, or alternatively, over-voltage damage, upon switching, as for example, in a write operation of the memory element. Also, in accordance with embodiments of the present invention, the array 120 of memory elements may be configured for digital computing, binary digital computing, as well as multilevel-logic. Thus, in accordance with embodiments of the present invention, the IC device 110 is not limited to memory devices as other IC environments are also within the spirit and scope of embodiments of the present invention. Furthermore, embodiments of the present invention for the programmable current-limited voltage buffer 130-1, which are subsequently described in greater detail (shown and later described in the discussion of FIGS. 2 through 6B), apply to and may be incorporated within the environment of IC device 110.

With further reference to FIG. 1, in accordance with embodiments of the present invention, the IC device 110 includes at least one memory element, for example, memory element 120-1 in the array 120 of memory elements 120-1, 120-2, 120-3 and 120-4, and at least one programmable current-limited voltage buffer 130-1 configured to protect the memory element during switching of the memory element. As shown in FIG. 1, the array 120 includes memory elements 120-1, 120-2, 120-3 and 120-4, by way of example without limitation thereto, as the array 120 of memory elements 120-1, 120-2, 120-3 and 120-4 may include more than one memory element, or alternatively, more than the four memory elements labeled in FIG. 1. In accordance with embodiments of the present invention, the IC device 110 includes a substrate 115, for example, a semiconductor substrate such as silicon (Si); and thus, integrated circuitry of the IC device 110 may include complementary-metal-oxide-semiconductor (CMOS) silicon integrated circuitry. As used herein, the term of art, "integrated circuit," or "IC," may refer to circuitry integrated in diverse blocks of circuitry on the substrate 115; but, the term of art, "integrated circuit," or "IC," may also refer to "chips," which are fully integrated monolithic IC devices. Therefore, as shown in FIG. 1, in accordance with embodiments of the present invention, the programmable current-limited voltage buffer 130-1 may include complementary-metal-oxide-semiconductor (CMOS) silicon integrated circuitry that includes circuitry integrated in a block of circuitry on the substrate 115.

With further reference to FIG. 1, in accordance with embodiments of the present invention, the programmable current-limited, voltage buffer 130-1 may be coupled to: a row-line driver enable line 130-1A; a current-limit enable line 130-1B; an over-current output-signal line 130-1C; a first rail 170 of a power supply, for example, an electrical-buss line for $V_{DD}$ through lead 170-1; and a reference-voltage source 178, for example, an electrical-buss line for ground through lead 178-1. Similarly, the programmable current-limited voltage buffer 130-2 is coupled to: a row-line driver enable line 130-2A; a current-limit enable line 130-2B; an over-current output-signal line 130-2C; a first rail 170 of a power supply, for example, an electrical-buss line for $V_{DD}$ through lead 170-2; and a reference-voltage source 178, for example, an electrical-buss line for ground through lead 178-2. For purposes of the following discussion, a first rail 170 of a power supply is at a positive potential with respect to ground; and, a second rail of a power supply is at a negative potential with respect to ground; however, embodiments of the present invention are not limited to such polarities of the first and second rails of a power supply, as other polarities and different potentials with respect to ground are within the spirit and scope of embodiments of the present invention when appropriate changes in the polarities and biasing of the circuit components subsequently described are provided for.

With further reference to FIG. 1, in accordance with embodiments of the present invention, the IC device 110 also includes a column-line buffer 150-1 that is configured to apply a column-line voltage to the memory element 120-1 sufficient to draw a current from the current-bias circuit 230-1 sufficient to write the memory element 120-1. In accordance with embodiments of the present invention, column-line buffer 150-1 may be coupled to: a column-line driver enable line 150-1A; a second rail 174 of a power supply, for example, an electrical-buss line for $V_{SS}$ through lead 174-1; and a reference-voltage source 178, for example, an electrical-buss line for ground through lead 178-3. In one embodiment of the present invention, the programmable current-limited voltage buffer 130-1 includes a row-line over-current detection circuit that is configured to output an over-current signal if an integrated row line power output, which is an energy used to write the memory element 120-1, from the inverter 230-2 exceeds a threshold value that is at a safe margin below a value at which irreversible damage may occur in the memory element 120-1; an inverted logic sense of the over-current signal output on the over-current output-signal line 130-1C may be ANDed with a column-line driver enable signal to gate ON the column-line buffer 150-1, so that initially the column line 160-1 is activated through the column-line buffer 150-1 and, upon the condition that the over-current signal is sent from over-current output-signal line 130-1C, the column line 160-1 is de-activated, to prevent damage to the memory element 120-1. Similarly, in accordance with embodiments of the present invention, column-line buffer 150-2 may be coupled to: a column-line driver enable line 150-2A; a second rail 174 of a power supply, for example, an electrical-buss line for $V_{SS}$ through lead 174-2; and a reference-voltage source 178, for example, an electrical-buss line for ground through lead 178-4.

With further reference to FIG. 1, in accordance with embodiments of the present invention, the signal input on row-line driver enable line 130-1A may be a binary digital signal including a bit string of logical zeroes and ones, such that (for positive logic) a one corresponds to a high, or positive, voltage level, and a zero corresponds to a low, or negative, voltage level. On the other hand in the case of multilevel logic, in another embodiment of the present invention, the row-line driver enable line 130-1A may also carry a binary logic level; however, the reference voltage, labeled $V_{WRITE}/2$ in FIG. 2, on the write-current set control circuit 230-3 might be varied in multilevel-logic applications, so that the reference voltage on the line labeled $V_{WRITE}/2$ may be set at varied voltage levels that may differ from $V_{WRITE}/2$. In accordance with embodiments of the present invention, the IC device 110 may include individual programmable current-limited voltage buffers using a binary digital input signal. Depending on the type of signal input into a programmable current-limited voltage buffer, for example, programmable current-limited voltage buffer 130-1, the biasing scheme for the memristors and the programmable current-limited voltage buffer may differ from the biasing scheme shown in FIG. 1, which is consistent with CMOS technology, as other biasing schemes and circuit technologies, for example, without limitation thereto, such as n-channel metal-oxide-semiconductor (nMOS) technology, p-channel metal-oxide-semiconductor (pMOS) technology and bipolar transistor based technologies, are also within the spirit and scope of embodiments of the present invention. However, as subsequently described, specific circuit implementations for various circuit blocks in the programmable current-limited voltage buffer 130-1 are described as being implemented in CMOS technology, for example, based on Si. Moreover, the circuit blocks of the IC device 110 as shown in FIG. 1 are by way of example without limitation thereto, as other circuit blocks (not shown), which are also within the spirit and scope of embodiments of the present invention, may also be included in the IC device 110, for example, read-out circuitry (not shown) for reading out the states of memory elements, for example, memory elements 120-1, 120-2, 120-3 and 120-4, in the array 120. A configuration of various circuit blocks within the programmable current-limited voltage buffer 130-1 is next described.

With reference now to FIG. 2, in accordance with embodiments of the present invention, a block diagram 200 shows an example programmable current-limited voltage buffer 130-1. As shown in FIG. 2, the programmable current-limited voltage buffer 130-1 is shown without the row-line over-current detection circuit, described above, in the interest of simplifying the discussion. However, a programmable current-limited voltage buffer including the row-line over-current detection circuit that is configured to output an over-current signal if an integrated row line power output from the inverter 230-2 exceeds a threshold value that is at a safe margin below a value at which irreversible damage may occur in the memory element 120-1 is within the spirit and scope of embodiments of the present invention. FIG. 2 illustrates a functional arrangement of circuit blocks in the programmable current-limited voltage buffer 130-1 that is configured to limit current flowing through at least one memory element 120-1, as shown in FIG. 1. In accordance with embodiments of the present invention, the programmable current-limited voltage buffer 130-1 includes at least one current-bias circuit 230-1, an inverter 230-2, a write-current set control circuit 230-3, and an adaptive current limiter 230-4. The current-bias circuit 230-1 is coupled to a first rail 170 of a power supply. The inverter 230-2 is coupled to the current-bias circuit 230-1 and a reference-voltage source 178, and is configured to couple a row line 140-1 of a memory element 120-1 to either the current-bias circuit 230-1, or the reference-voltage source 178, in response to an input signal. The adaptive current limiter 230-4 is coupled to the current-bias circuit 230-1 and to the write-current set control circuit 230-3, and is configured to limit current flowing through the memory element 120-1 in a write operation of the memory element 120-1.

With further reference to FIG. 2, in accordance with one embodiment of the present invention, the block diagram 200 shows a circuit block of an example of the current-bias circuit 230-1 that includes, without limitation thereto, a current mirror, which may be used in the programmable current-limited voltage buffer 130-1. By way of example without limitation thereto, in accordance with one embodiment of the present invention, the current mirror may include two p-channel enhancement mode metal-oxide-semiconductor field effect transistors (MOSFETs); the gates of the two p-channel enhancement mode MOSFETs are coupled together in common; and, the sources of the two p-channel enhancement mode MOSFETs are also coupled together in common. The common gates of the two p-channel enhancement mode MOSFETs are coupled to one lead of the current-bias circuit 230-1, which is coupled to the adaptive current limiter 230-4 in common with a first node 234-2. The common sources of the two p-channel enhancement mode MOSFETs are coupled to lead 170-1, which is coupled to the first rail 170 of the power supply, for example, the electrical-buss line for $V_{DD}$. The drain of one p-channel enhancement mode MOSFET is coupled to a lead, which is coupled to the inverter 230-2. The drain of the other p-channel enhancement mode MOSFET is coupled to the common gates of the two p-channel enhancement mode MOSFETs and to the lead that is coupled to the adaptive current limiter 230-4 in common with the first node 234-2.

With further reference to FIG. 2, in accordance with another embodiment of the present invention, the circuit configuration of the two p-channel enhancement mode MOSFETs provides a current mirror which limits the available current provided from the first rail 170 of the power supply, for example, electrical-buss line for $V_{DD}$, to the inverter 230-2 in proportion to a control current that flows to first node 234-2 of the adaptive current limiter 230-4. Thus, in accordance with embodiments of the present invention, the current available to switch the state of a memory element, for example, one of memory elements 120-1, 120-2, 120-3 and 120-4, from the output line of the inverter 230-2 that is coupled to the row line 140-1, which may be provided from the first rail 170 of the power supply, for example, electrical-buss line for $V_{DD}$, is limited by the action of the current mirror in proportion to the control current that flows to first node 234-2 of the adaptive current limiter 230-4.

With further reference to FIG. 2, in accordance with another embodiment of the present invention, the block diagram 200 shows a circuit block of an example of the inverter 230-2 that is configured to couple at least one memory element, for example, one of memory elements 120-1 and 120-4 on row line 140-1, to at least one of the current-bias circuit 230-1 and the reference-voltage source 178 in response to an input signal applied to the inverter 230-2, for example, the row-line driver enable signal on row-line driver enable line 130-1A. By way of example without limitation thereto, in accordance with one embodiment of the present invention, the inverter 230-2 may include a p-channel enhancement mode MOSFET and a n-channel enhancement mode MOSFET; the gates of the p-channel enhancement mode MOSFET and the n-channel enhancement mode MOSFET are coupled together in common; and, the drain of the p-channel enhancement mode MOSFET and the drain of the n-channel enhancement mode MOSFET are coupled together in common. The source of p-channel enhancement mode MOSFET is coupled to a lead of the inverter 230-2 that is coupled to the current-bias circuit 230-1. The source of n-channel enhancement mode MOSFET is coupled to a lead 178-1 of the inverter 230-2, which is coupled to the reference-voltage source 178. The common gates of the p-channel enhancement mode MOSFET and the n-channel enhancement mode MOSFET are coupled to row-line driver enable line 130-1A through the inverting input buffer 230-5. The drain of the p-channel enhancement mode MOSFET and the drain of the n-channel enhancement mode MOSFET, which are coupled together in common, are coupled town output line of the inverter 230-2, which is coupled to the row line 140-1. The circuit configuration of the p-channel enhancement mode MOSFET and the n-channel enhancement mode MOSFET, as shown in FIG. 2, provides an inverter 230-2, which applies a voltage to a memory element, for example, one of memory elements 120-1 and 120-4 that are coupled to the inverter 230-2 through the row line 140-1.

With further reference to FIG. 2, in accordance with another embodiment of the present invention, for a binary digital input signal, for example, a bit string of ones and zeroes, applied to row-line driver enable line 130-1A, the inverter 230-2 applies a voltage, which has the same polarity as the polarity of the voltage of the input signal, to the row line 140-1 coupled to the inverter 230-2, and drives the voltage on the row line 140-1 of the inverter 230-2 towards one or other voltages of the first rail 170 of the power supply, or the reference-voltage source 178. In one embodiment of the present invention, the same polarity of the input signal to the row-line driver enable line 130-1A and the output signal to the row line 140-1 is provided by inverting input buffer 230-5. As used herein, the phrase, "drives the voltage on the row line 140-1 of the inverter 230-2 towards one or other voltages of the first rail 170 of the power supply, or the reference-voltage source 178," does not necessarily imply that the voltage on the row line 140-1 coupled to the output line of the inverter 230-2 actually saturates at one or the other of these voltages, as there may be a voltage drop between the sources of these voltages and the leads to the inverter 230-2, for example, due to the action of the current mirror included in the current-bias circuits 230-1.

Thus, with further reference to FIG. 2, in accordance with an embodiment of the present invention, the voltage available from the row line 140-1 coupled to the output line of the inverter 230-2 to switch the state of a memory element, for example, one of memory elements 120-1 and 120-4, may be controlled: for example, a positive voltage to produce a low-resistance, ON, state in the memory element, which is suitable for digital computing. On the other hand, in another embodiment of the present invention, a multilevel-logic application may adjust the resistance of the memristors in a gradual (non-binary) way, which may be done by a finer control of the write current, and possibly the write voltage, as well. To control the write current, the inventors envision multiple versions of the 234-3 block that could be switched in, or alternatively, the lower reference ground point of 234-3 may be used as a control input of the programmable current-limited voltage buffer 130-1. To control the write voltage, the input to block 230-3 labeled $V_{WRITE}/2$ in FIG. 2 may be used as a control input of the programmable current-limited voltage buffer 130-1 with a multilevel input signal. However, the row-line driver enable 130-1A would not be used as an, analog input to deliver a less-strong write pulse. In accordance with embodiments of the present invention, the voltage available on the row line 140-1 coupled to the output line of the inverter 230-2 to switch the state of a memory element, for example, one of memory elements 120-1 and 120-4, may be controlled: for example, an intermediate voltage to produce an intermediate resistance state in the memory element, which is suitable for multilevel logic. At the same time that the voltage on the row line 140-1 coupled to the output line of the inverter 230-2 is applied to the memory element, for example, one of memory elements 120-1 and 120-4, the current flowing to the memory element from the row line 140-1 coupled to the output line of the inverter 230-2 is limited by the action of the current mirror of current-bias circuit 230-1 in proportion to the control current that flows to the adaptive current limiter 230-4. Consequently, in accordance with embodiments of the present invention, an over-current condition leading to current run-away through a memory element, for example, one of memory elements 120-1 and 120-4, such as a memristor, can be prevented from occurring during switching of the memory element, such that the memory element is protected from short-circuit damage.

Moreover, a similar circuit (not shown) to that of the programmable current-limited voltage buffer 130-1 shown in FIG. 2, but configured to provide a write voltage and a write current of equal polarity to the second rail 174 of the power supply, for example, electrical-buss line for $V_{SS}$, is also within the spirit and scope of the present invention. Thus, in accordance with an embodiment of the present invention, the voltage available from the row line 140-1 coupled to the output line of an inverter similar to inverter 230-2 to switch the state of a memory element, for example, one of memory elements 120-1 and 120-4, may be controlled: for example, a negative voltage to produce a high-resistance, OFF, state in the memory element, which is suitable for digital computing. Consequently, in accordance with embodiments of the present invention, an over-current condition leading to current run-away through a memory element, for example, one of memory elements 120-1 and 120-4, such as a memristor, can be prevented from occurring during switching of the memory element, such that the memory element is protected from short-circuit damage.

Moreover, although one lead of the inverter 230-2 is shown tied to a reference-voltage source 178 at ground potential through the lead 178-1, embodiments of the present invention encompassing a combination of the circuits described above for writing an ON state and an OFF state to a memory element, for example, memory element 120-1, also include a reference-voltage source 178 sourced from a circuit similarly configured to the current-bias circuit 230-1, the write-current set control circuit 230-3, and the adaptive current limiter 230-4 of the programmable current-limited voltage buffer 130-1 shown in FIG. 2, but configured to provide a write voltage and a write current of equal polarity to the second rail 174 of the power supply, for example, electrical-buss line for $V_{SS}$, to that of the programmable current-limited voltage buffer 130-1 shown in FIG. 2. Thus, in accordance with embodiments of the present invention, the voltage available from the row line 140-1 coupled to the output line of the inverter 230-2 to switch the state of a memory element, for example, one of memory elements 120-1 and 120-4, may be controlled: for example, a negative voltage to produce a high-resistance, OFF, state in the memory element, and a positive voltage to produce a low-resistance, ON, state in the memory element, which is suitable for digital computing. In accordance with embodiments of the present invention, the voltage available on the row line 140-1 coupled to the output line of the inverter 230-2 to switch the state of a memory element, for example, one of memory elements 120-1 and 120-4, may be controlled: for example, an intermediate voltage to produce an intermediate resistance state in the memory element, which is suitable for multilevel logic, as previously described. At the same time that the voltage on the row line 140-1 coupled to the output line of the inverter 230-2 is applied to the memory element, for example, one of memory elements 120-1 and 120-4, the current flowing to the memory element from the row line 140-1 coupled to the output line of the inverter 230-2 is limited by the action of the current mirrors of current-bias circuit 230-1 and an analogous current-bias circuit of opposite polarity (not shown) in proportion to the control current that flows through the adaptive current limiter 230-4 and an analogous adaptive current limiter of opposite polarity (not shown). Consequently, in accordance with embodiments of the present invention, an over-current condition leading to current run-away through a memory element, for example, one of memory elements 120-1 and 120-4, such as a memristor, can be prevented from occurring during switching of the memory element, such that the memory element is protected from short-circuit damage.

With further reference to FIG. 2, in accordance with embodiments of the present invention, the write-current set control circuit 230-3 includes an operational amplifier, the operational amplifier configured to compare an output voltage of the row line 140-1 against a write voltage reference level, which in one embodiment of the present invention is a positive voltage level at half of a full write-voltage level, +V/2, for the memory element 120-1, without limitation thereto; the operational amplifier is also configured to set a current sourced to the row line 140-1 from the current-bias circuit 230-1 to at least a half-select current level, $i_{HS}$, of the row line 140-1. As used herein, the full write-voltage level of a single memory element, for example, memory element 120-1, may be designated by V, or alternatively, by $V_{WRITE}$, which is a positive definite value that is equal to an absolute value; a positive voltage level at half of a full write-voltage level may be designated by +V/2, or alternatively, by +$V_{WRITE}$/2; a negative voltage level at half of a full write-voltage level may be designated by –V/2, or alternatively, by –$V_{WRITE}$/2; and, the terms of art, "voltage" and "voltage level," and "current" and "current level," respectively, may be used interchangeably, as well as respective symbols referring thereto.

With further reference to FIG. 2, in accordance with another embodiment of the present invention, the adaptive current limiter 230-4 may include: a current-limiting element 234-1, a first terminal of the current-limiting element 234-1 coupled to a first node 234-2, which is coupled to one lead of the current-bias circuit 230-1; a write-current limiter 234-3 coupled to the first node 234-2; and a sample-and-hold circuit 234-4 coupled to a control node 234-5, the control node 234-5 coupled to a second terminal of the current-limiting element 234-1. In an embodiment of the present invention, the adaptive current limiter 230-4 is configured to sum a half-select current level, $i_{HS}$, for the row line 140-1 plus a current-limited write current, $i_{CL}$, and to limit a write current provided by the current-bias circuit 230-1 to the memory element 120-1 written on the row line 140-1 to a sum of the half-select current level, $i_{HS}$, for the row line 140-1 plus the current-limited write current, $i_{CL}$, to write the memory element 120-1. In another embodiment of the present invention, the adaptive current limiter 230-4 may include a current-limiting element 234-1 selected from the group consisting of a current-limiting resistor of fixed value, as shown in FIG. 2, a potentiometer 310-1, an adaptive resistance, and a switched-capacitor 410 (see discussion of FIGS. 3 and 4 for more description of the latter embodiments). In another embodiment of the present invention, the write-current limiter 234-3 may include: a second current-bias circuit 234-3A; and, a second current-limiting element 234-3B, the second current-limiting element 234-3B coupled to the second current-bias circuit 234-3A and coupled to the first rail 170 of the power supply, such that the second current-limiting element 234-3B is configured to limit a portion of the current drawn by the second current-bias circuit 234-3A from the first node 234-2 of the adaptive current limiter 230-4 to the current-limited write current, $i_{CL}$, provided by the current-bias circuit 230-1 to the memory element 120-1 written on the row line 140-1.

With further reference to FIG. 2, in accordance with One embodiment of the present invention, the block diagram 200 shows a circuit block of an example of the second current-bias circuit 234-3A that includes, without limitation thereto, a second current mirror, which may be used in the programmable current-limited voltage buffer 130-1. By way of example without limitation thereto, in accordance with one embodiment of the present invention, the second current mirror may include two n-channel enhancement mode MOSFETs; the gates of the two n-channel enhancement mode MOSFETs are coupled together in common; and, the sources of the two n-channel enhancement mode MOSFETs are also coupled together in common. The common gates of the two n-channel enhancement mode MOSFETs are coupled to one lead of the second current-bias circuit 234-3A, which is coupled to the second current-limiting element 234-3B. The common sources of the two n-channel enhancement mode MOSFETs are coupled to a lead that is coupled to the reference-voltage source 178 at ground potential, which may be through the lead 178-1 (but not shown as such in FIG. 2). The drain of one n-channel enhancement mode MOSFET is coupled to a lead, which is coupled to the first node through a transmission gate that is gated CLOSED, and a channel of a FET that is used in the transmission gate is of low resistance, when the current-limiting enable signal on the current-limit enable line 130-1B goes HIGH. The drain of the other n-channel enhancement mode MOSFET is coupled to the common gates of the two n-channel enhancement mode MOSFETs and to a lead that is coupled to the second current-limiting element 234-3B.

As used herein, the terms of art, "CLOSED," "closed, "CLOSE," or "close," refer to a state of the transmission gate as though the transmission gate were acting as a switch; thus, the terms of art, "CLOSED," "closed, "CLOSE," or "close," refer to an FET that is used in a transmission gate, in which the channel is in the high conductivity, or "ON" state, so that the analogous switch is closed. Similarly, as used herein, the terms of art, "OPENED," "opened, "OPEN," or "open," refer to a state of a transmission gate as though the transmission gate were also acting as a switch; thus, the terms of art, "OPENED," "opened, "OPEN," or "open," refer to an FET that is used in a transmission gate, in which the channel is in the low conductivity, or "OFF" state, so that the analogous switch is opened.

With further reference to FIG. 2, in accordance with another embodiment of the present invention, the circuit configuration of the two n-channel enhancement mode MOSFETs provides a second current mirror which increases the available current provided from the first rail 170 of the power supply, for example, electrical-buss line for $V_{DD}$, to the inverter 230-2 depending on the amount of the current drawn by the second current-bias circuit 234-3A from the first node 234-2 of the adaptive current limiter 230-4 by an amount equal to the current-limited write current, $i_{CL}$. The effect of the second current mirror is independent of the other current being drawn out of node 234-2 by the current-limiting element 234-1, which may be a resistor, so that an increase in the current limit is above the current limit established by the write-current set control 230-3 to support the full row line of memory elements at the half-select $+V_{WRITE}/2$ voltage. Thus, in accordance with embodiments of the present invention, the current available to switch the state of a memory element, for example, one of memory elements 120-1 and 120-4, from the output line of the inverter 230-2 that is coupled to the row line 140-1, which may be provided from the first rail 170 of the power supply, for example, electrical-buss line for $V_{DD}$, is limited by the action of the second current mirror depending on the amount of the current drawn by the second current-bias circuit 234-3A from the first node 234-2 of the adaptive current limiter 230-4 to the current-limited write current, $i_{CL}$.

With further reference to FIG. 2, in accordance with one embodiment of the present invention, the block diagram 200 shows a circuit block of an example of the second current-limiting element 234-3B. In one embodiment of the present invention, the second current-limiting element 234-3B may include, without limitation thereto, a circuit element selected from the group consisting of a current-limiting resistor of fixed value for setting a current-limited write current for binary digital logic, and a potentiometer of selectable resistance for setting a current-limited write current of various levels for multilevel logic. More generally, in accordance with embodiments of the present invention, similar to current-limiting element 234-1 of the adaptive current limiter 230-4, the second current-limiting element 234-3B may also include a circuit selected from the group consisting of a limiting resistor, as shown in FIG. 2, a potentiometer 310-1, an adaptive resistance, and a switched-capacitor 410 (see discussion of FIGS. 3 and 4 for more description of the latter embodiments).

With further reference to FIG. 2, in accordance with one embodiment of the present invention, the block diagram 200 shows a circuit block of an example of the sample-and-hold circuit 234-4. In one embodiment of the present invention, the sample-and-hold circuit 234-4 may include a capacitor and a voltage follower that are interconnected as shown in the circuit block of the sample-and-hold circuit 234-4; the operational amplifier may be configured as a voltage follower, as shown in FIG. 2. In one embodiment of the present invention, the sample-and-hold circuit 234-4 samples the output voltage from the write-current set control circuit 230-3 when the input signal applied on the current-limit enable line 130-1B is LOW; an inverting output of a input buffer 234-6 with an inverting output and non-inverting output provides an output signal that is HIGH when the input signal applied on the current-limit enable line 130-1B is LOW; the inverting output of the input buffer 234-6 gates a transmission gate that is disposed between the sample-and-hold circuit 234-4 and the write-current set control circuit 230-3 CLOSED when the current-limit enable line 130-1B is LOW, which charges the capacitor and allows the sample-and-hold circuit 234-4 to sample the output voltage from the write-current set control circuit 230-3. Thus, in accordance with an embodiment of the present invention, the half-select current level, $i_{HS}$, for the row line 140-1 is drawn by the control node 234-5 when a second transmission gate is also CLOSED when the current-limit enable line 130-1 B is LOW, which interconnects the control node 234-5 with the output from the write-current set control circuit 230-3 that is also interconnected with the sample-and-hold circuit 234-4 when the current-limit enable line 130-1 B is LOW. In another embodiment of the present invention, the current-limit enable line 130-1B also goes HIGH, but is delayed relative to the signal on the row-line driver enable line 130-1A, so that when the current-limit enable line 130-1B is LOW the row line 140-1 is allowed to mirror through current-bias circuit 230-1 the current drawn by the control node 234-5, which is the half-select current level, $i_{HS}$, for the row line 140-1.

With further reference to FIG. 2, in accordance with an embodiment of the present invention, when the current-limit enable line 130-1B also goes HIGH, the non-inverting output of the input buffer 234-6 provides an output signal that is HIGH; the inverting output of a input buffer 234-6 then provides an output signal that is LOW and closes the two transmission gates that respectively interconnect the output from the write-current set control circuit 230-3 with the sample-and-hold circuit 234-4, and the control node 234-5; this action isolates the voltage on the capacitor of the sample-and-hold 234-4, allowing that node to maintain or hold the output voltage of the write-current set control 230-3. Also, in an embodiment of the present invention, a HIGH level on the non-inverting output of the input buffer 234-6 gates two transmission gates ON: one of the transmission gates, as described above, which is connected between the first node 234-2 and the write-current limiter 234-3 allows an extra amount of current equal to the current-limited write current, $i_{CL}$, to be drawn by the first node 234-2 from the current-bias circuit 230-1; and, another of the transmission gates, which is connected between the control node 234-5 and the sample-and-hold circuit 234-4, maintains drawing the half-select current level, $i_{HS}$, by the sample-and-hold circuit 234-4. Thus, in an embodiment of the present invention, the current drawn by the row line 140-1 to write the memory element, for example, one of memory elements 120-1 or 120-4, depending upon which is selected by a column-line buffer, is limited to the sum of the half-select current level, $i_{HS}$, for the row line 140-1 plus the current-limited write current, $i_{CL}$, which prevents damage to the memory element being written.

Figure 3:
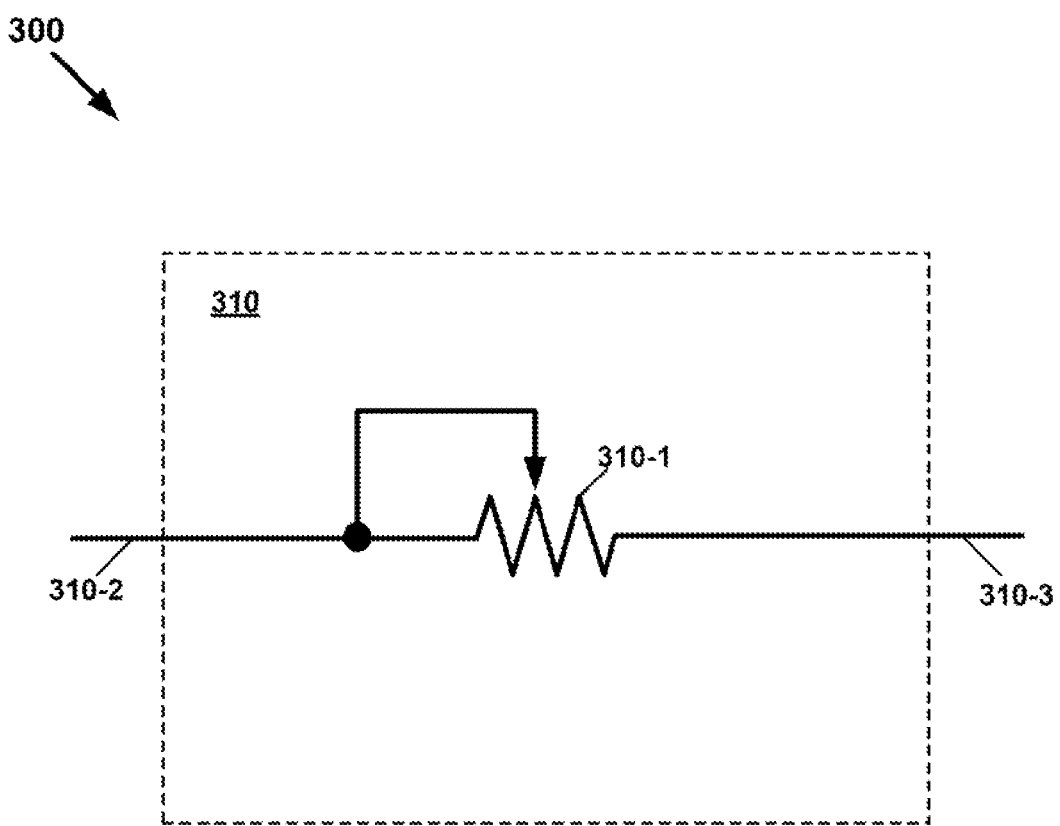
FIG. 3 is a circuit diagram of a circuit block including a current-limiting element, for example, a potentiometer that may serve as an adaptive resistance, configured to limit current flowing through the memory element shown in FIG. 2, in accordance with an embodiment of the present invention.

With reference now to FIG. 3, in accordance with an embodiment of the present invention, a circuit diagram 300 shows a circuit block of a current-limiting element 310, which may be either of current-limiting element 234-1, and/or, second current-limiting element 234-3B; current-limiting element 310 is configured to limit current flowing through a memory element shown in FIG. 2. As shown in FIG. 3, by way of example without limitation thereto, in accordance with one embodiment of the present invention, current-limiting element 310 includes an adaptive resistance, for example, a potentiometer 310-1, that is configured to limit current flowing through the memory element, for example, one of memory elements 120-1, 120-2, 120-3 and 120-4. In one embodiment of the present invention, the current-limiting element 310 may include an active circuit having a control input that allows the active circuit to behave like a potentiometer with a resistance value controlled by the control input, essentially as an adaptive resistance. In one embodiment of the present invention in which current-limiting element 234-1 includes the current-limiting element 310, one lead 310-2 of the potentiometer 310-1 may be coupled to the lead of the adaptive current limiter 230-4 in common with first node 234-2, which is coupled to the current-bias circuit 230-1; and, the other lead 310-3 of the potentiometer 310-1 may be coupled to the control node 234-5 of the adaptive current limiter 230-4. In another embodiment of the present invention in which second current-limiting element 234-3B includes the current-limiting element 310, one lead 310-2 of the potentiometer 310-1 may be coupled to a lead of the second current-bias circuit 234-3A; and, the other lead 310-3 of the potentiometer 310-1 may be coupled to lead 170-1, which is coupled to the first rail 170 of the power supply, for example, the electrical-buss line for $V_{DD}$. Thus, in accordance with embodiments of the present invention, the current flowing to the memory elements from the row line 140-1 coupled to the output line of the inverter 230-2 is limited by the action of the current-bias circuit 230-1 and the adaptive current limiter 230-4 in proportion to the control current that flows to the first node 234-2 of the adaptive current limiter 230-4 determined by the currents drawn from the first node 234-2 by the potentiometer 310-1 for either of current-limiting element 234-1, and/or, second current-limiting element 234-3B.

Figure 4:
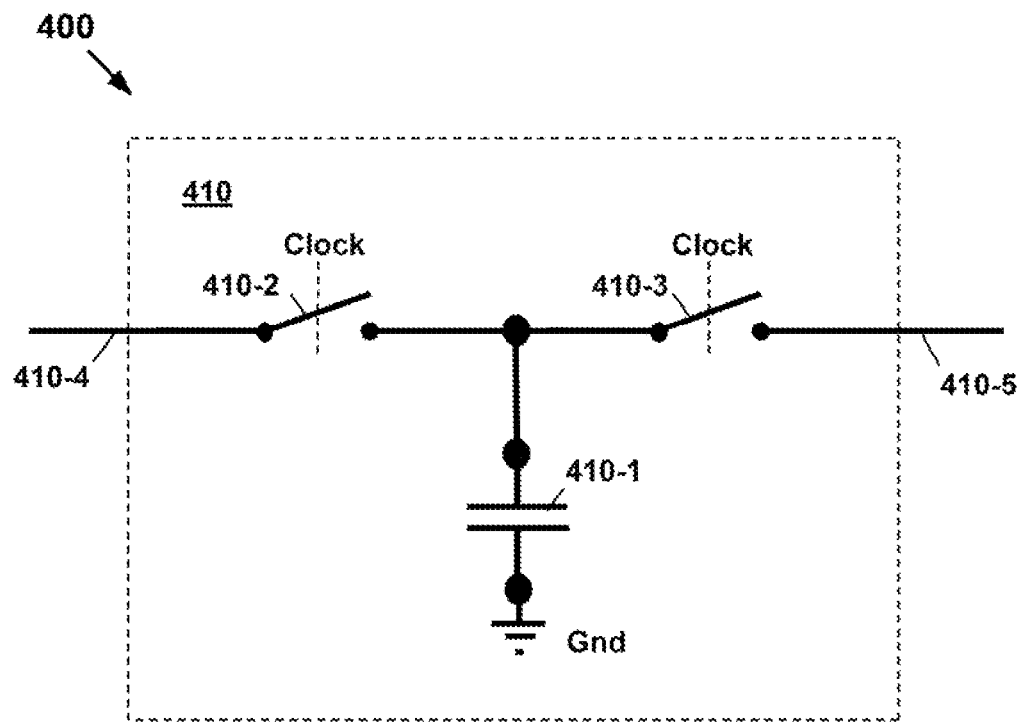
FIG. 4 is a circuit diagram of a circuit block including a current-limiting element, for example, a switched-capacitor, configured to limit current flowing through the memory element shown in FIG. 2, in accordance with an embodiment of the present invention.

With reference now to FIG. 4, in accordance with another embodiment of the present invention, a circuit diagram 400 is shown for a circuit block of yet another example of a current-limiting element, which may be either of current-limiting element 234-1, and/or, second current-limiting element 234-3B; the current-limiting element is configured to limit current flowing through a memory element shown in FIG. 2. As shown in FIG. 4, by way of example without limitation thereto, in accordance with one embodiment of the present invention, the current-limiting element includes a switched-capacitor 410, also referred to by the term of art, "switch-cap," that includes capacitor 410-1 and first and second switches 410-2 and 410-3, respectively, that is configured to limit current flowing through a memory element, for example, one of memory elements 120-1, 120-2, 120-3 and 120-4. In one embodiment of the present invention, one lead of the capacitor 410-1 is coupled to ground; the other lead of the capacitor 410-1 is coupled in common to a second terminal of the first switch 410-2 and to a first terminal of the second switch 410-3. As further shown in FIG. 4, by way of example without limitation thereto, in one embodiment of the present invention in which current-limiting element 234-1 includes the switched-capacitor 410, the first terminal of the first switch 410-2, which may include gated complementary MOSFETs configured as a CMOS transmission gate (not shown) that open and close in response to a clock signal (clock), is coupled to lead 410-4 of the switched-capacitor 410, which may be coupled to the lead of the adaptive current limiter 230-4 in common with first node 234-2, which is coupled to the current-bias circuit 230-1; and, the second terminal of the second switch 410-3, which may include gated complementary MOSFETs configured as a CMOS transmission gate (not shown) that also open and close in response to a clock signal (clock), is coupled to the other lead 410-5 of the switched-capacitor 410, which may be coupled to the control node 234-5 of the adaptive current limiter 230-4. By way of further example without limitation thereto, in another embodiment of the present invention in which second current-limiting element 234-3B includes the switched-capacitor 410, the first terminal of the first switch 410-2 is coupled to lead 410-4 of the switched-capacitor 410, which may be may be coupled to a lead of the second current-bias circuit 234-3A; and, the second terminal of the second switch 410-3 is coupled to the other lead 410-5 of the switched-capacitor 410, which is coupled to lead 170-1, which is coupled to the first rail 170 of the power supply, for example, the electrical-buss line for $V_{DD}$. Thus, in accordance with embodiments of the present invention, the current flowing to the memory elements from the row line 140-1 coupled to the output line of the inverter 230-2 is limited by the action of the current-bias circuit 230-1 and the adaptive current limiter 230-4 in proportion to the control current that flows to the first node 234-2 of the adaptive current limiter 230-4 determined by the currents drawn from the first node 234-2 by capacitor 410-1 that may be determined by the closing of switches 410-2 and 410-3 in response to the frequency of the clock signal (clock). In an embodiment of the present invention, the switched-capacitor 410 is configured to limit a current from the current-bias circuit 230-1 to a half-select current level, $i_{HS}$, for the row line 140-1 in response to a first clock frequency, and to limit a current from the current-bias circuit 230-1 to a sum of the half-select current level, $i_{HS}$, for the row line 140-1 plus a current-limited write current, $i_{CL}$, in response to a second clock frequency to write the memory element 120-1. Embodiments of the present invention may include a switched-capacitor 410 for either of current-limiting element 234-1, or alternatively, second current-limiting element 234-3B. If current-limiting element 234-1 includes switched-capacitor 410, other elements of the adaptive current limiter 230-4 shown in FIG. 2, such as, the write-current limiter 234-3, and the sample-and-hold circuit 234-4, may be dispensed with.

With reference now to FIGS. 5A, 5B, 5C and 5D, schematic diagrams 500A, 500B, 500C and 500D are shown that illustrate various embodiments of the present invention. As shown in FIGS. 5A-5D, embodiments of the present invention include at least one programmable current-limited voltage buffer, for example, one of programmable current-limited voltage buffers 130-1 and 130-2, which is shown abstractly in FIGS. 5A, 5B, 5C and 5D, to drive one of the row lines, for example, row lines 140-1 and 140-2, of an array 120 of memory elements, for example, memory elements 120-1, 120-2, 120-3 and 120-4, which are located at the crossings of the row lines 140-1 and 140-2 and the column lines 160-1 and 160-2. In accordance with embodiments of the present invention, the operation of the programmable current-limited voltage buffer 130-1 is fairly straightforward. In accordance with embodiments of the present invention, the programmable current-limited voltage buffer 130-1 takes an input voltage, $V_{IN}$, which may be identified with the action of the row-line driver enable signal on row-line driver enable line 130-1A on the inverter 230-2 of FIGS. 1 and 2, and buffers the input voltage, $V_{IN}$, to an output voltage $V_{OUT}$, which may be identified with the row-line voltage on the row line 140-1 of FIGS. 1 and 2, where the condition, $V_{OUT}=V_{IN}$, is subject to a current limit specified on the CL input, identified with the signal on the current-limit enable line 130-1B of FIGS. 1 and 2. While the buffer symbol suggests the current limit is specified by a control voltage, in this description, a more abstract current specification is employed for the CL input, for example, $i_{CL}$, or alternatively, "none." The designation "none" will indicate that no current limit is in effect. If the load on the buffer causes the current limit to be exceeded at the output to maintain $V_{IN}$, then $V_{OUT}$ will be lowered until the output current equals the designated safe current-limited write current. Furthermore, in accordance with embodiments of the present invention, this overload condition will be signaled with a "true" logic level on the OV output signal, identified with the over-current signal output on the over-current output-signal line 130-1C of FIG. 1.

Figure 5A:
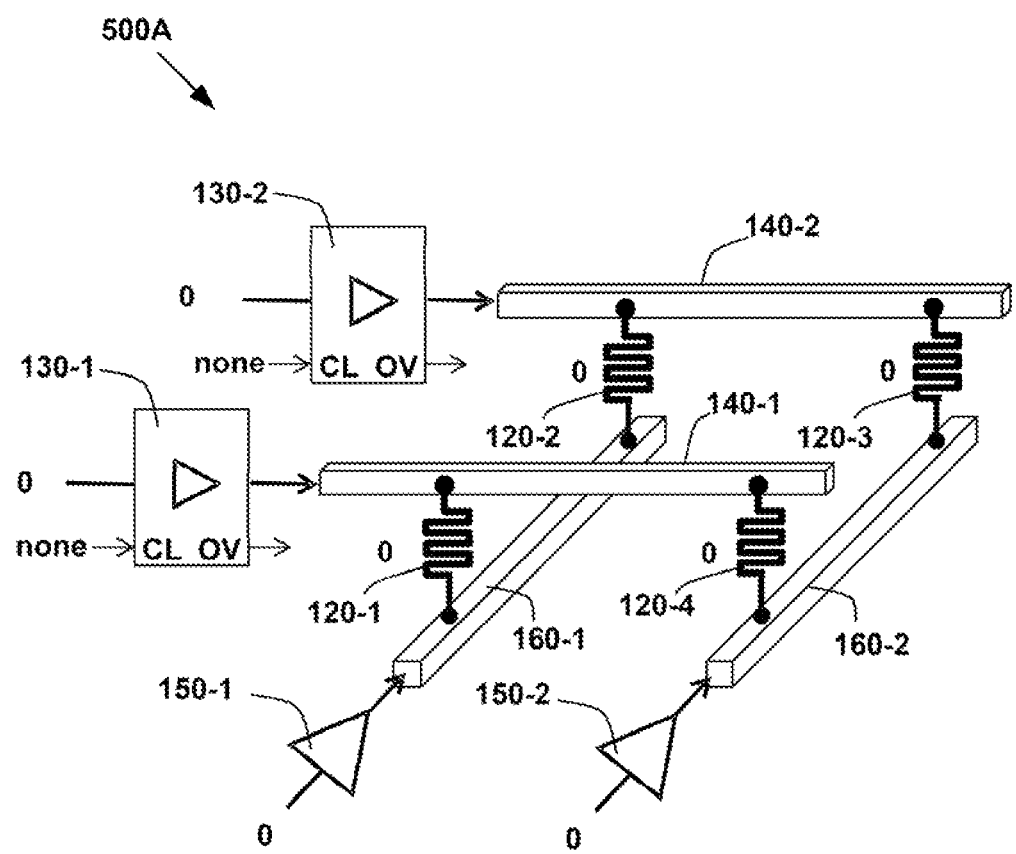
FIG. 5A is a schematic diagram illustrating a quiescent state of memory elements, for example, memristors, in the memory array of the integrated-circuit (IC) device of FIG. 1 before start of a write operation, in accordance with an embodiment of the present invention.
Figure 5B:
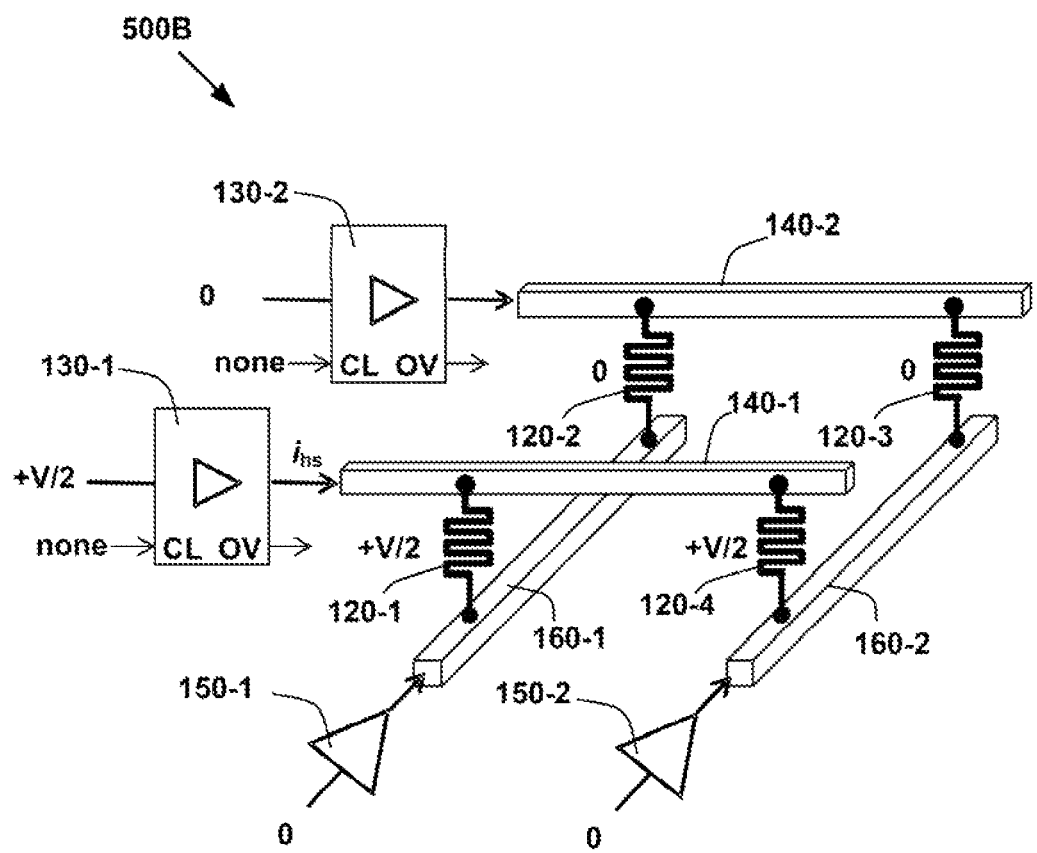
FIG. 5B is a schematic diagram illustrating a state of the memory elements in the memory array of the integrated-circuit (IC) device of FIG. 1 after the operation of: driving a selected row line at a positive voltage level, +V/2, and capturing the half-select current, $i_{HS}$, of the selected row line, in accordance with an embodiment of the present invention.
Figure 5C:
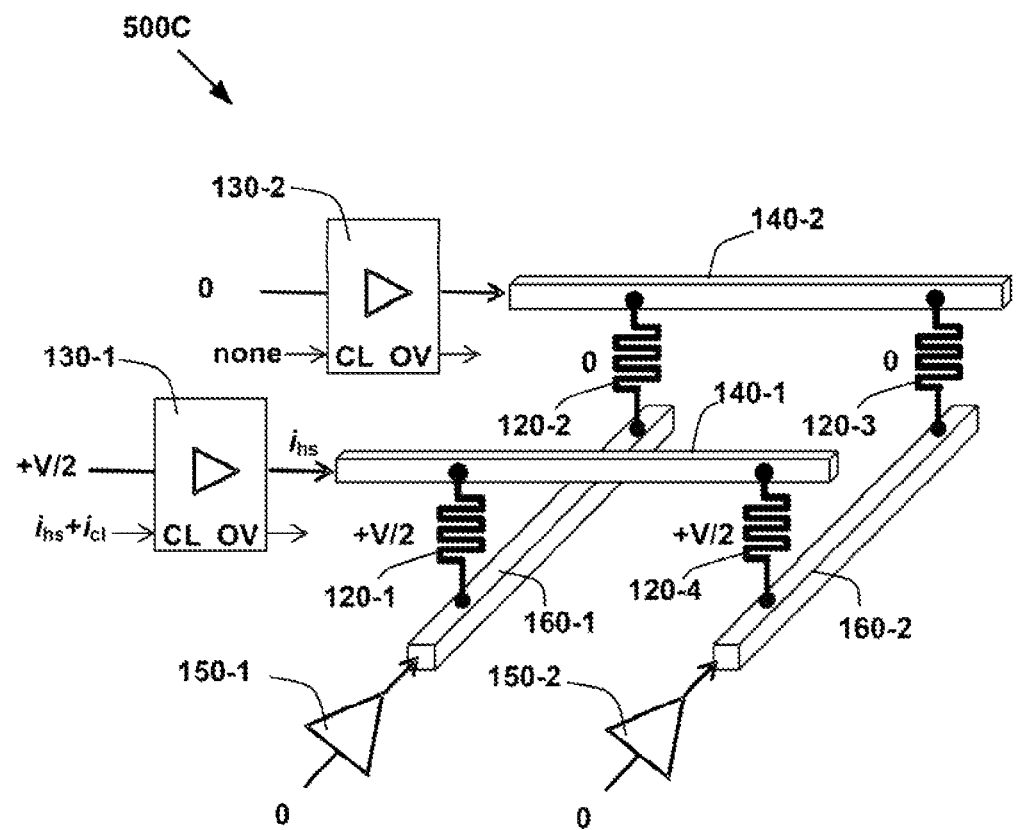
FIG. 5C is a schematic diagram illustrating a state of the memory elements in the memory array of the integrated-circuit (IC) device of FIG. 1 after the operation of: setting the programmable current-limit to the previously measured half-select current, $i_{HS}$, plus a designated safe current-limited write current of the fully selected device to be written, $i_{CL}$, in accordance with an embodiment of the present invention.
Figure 5D:
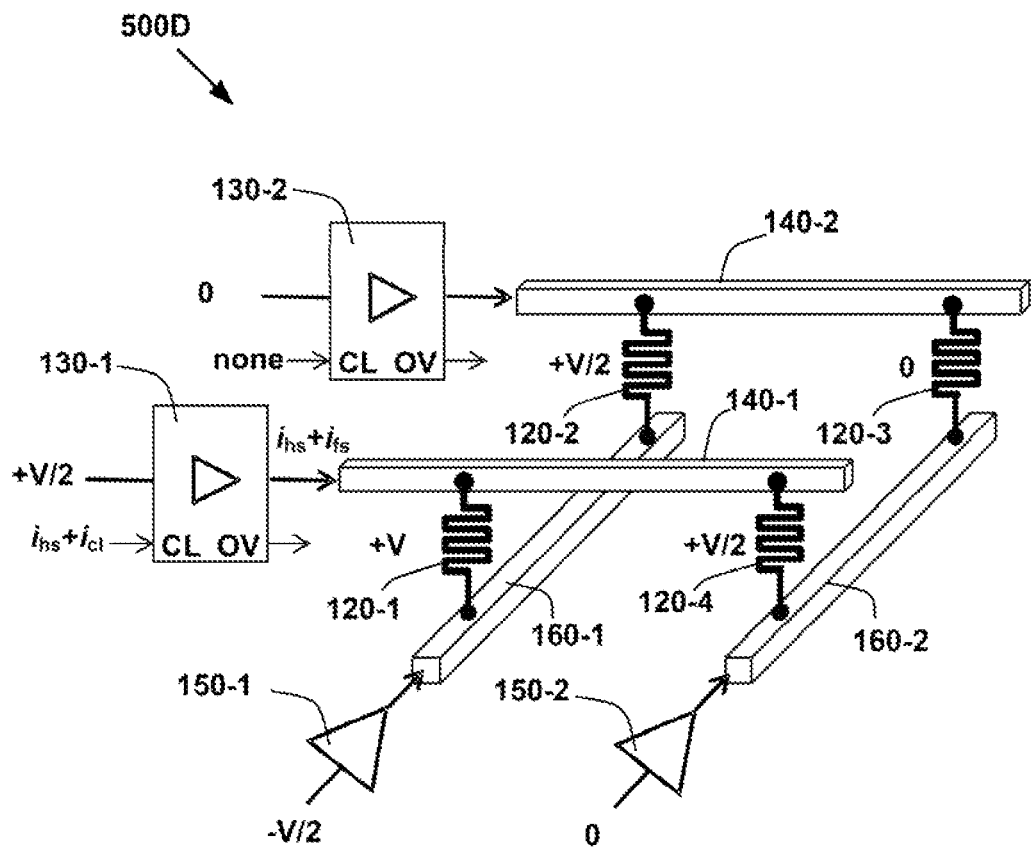
FIG. 5D is a schematic diagram illustrating a state of the memory elements in the memory array of the integrated-circuit (IC) device of FIG. 1 after the operation of: driving the selected column line at a negative voltage level, -V/2, showing a fully selected device current, $i_{FS}$, initially less than, $i_{CL}$, in accordance with an embodiment of the present invention.

With further reference to FIGS. 5A-5D, in accordance with embodiments of the present invention, operations in a method for current limiting, and/or, protecting, a memory element 120-1 during switching of the memory element 120-1 in an array 120 of memory elements are next described. In accordance with embodiments of the present invention, it may be assumed the array 120 of memory elements is initially in a quiescent state, with all row and column lines set to 0 volts, and with voltage drops across the memory elements 120-1, 120-2, 120-3 and 120-4 of 0 volts, as shown in FIG. 5A. FIG. 5A shows the programmable current-limited buffers, for example, programmable current-limited voltage buffers 130-1 and 130-2 of FIG. 1, driving the row lines, for example, row lines 140-1 and 140-2 of FIG. 1, respectively; and, simple buffers, identified with the column-line buffers 150-1 and 150-2 of FIG. 1, driving the column lines, for example, column lines 160-1 and 160-2 of FIG. 1, respectively. In accordance with embodiments of the present invention, the method includes the following operations: with no current limit in effect, driving the selected row line, for example, row line 140-1, at +$V_{WRITE}$/2, which produces voltage drops across the memory elements 120-1 and 120-4 of +V/2 volts, as shown in FIG. 5B; sampling and holding the half-select row line current, $i_{HS}$, for example on a row line 140-1, as also shown in FIG. 5B; setting the current limit of the programmable current-limited voltage buffer of the selected row line, for example, programmable current-limited voltage buffer 130-1 of the selected row line 140-1, to the previously measured half-select current, $i_{HS}$, plus a designated safe current-limited write current, $i_{CL}$, of a single-device, for example, memory element 120-1, as shown in FIG. 5C; and, driving a selected column line, for example, column line 160-1 selected from column lines 160-1 and 160-2, at −V/2, which produces a voltage drop across the memory element 120-1 of +V volts, and a voltage drop across the memory elements 120-2 and 120-4 of +V/2 volts, as shown in FIG. 5D. At this point in the course of performing operations of the method, an operation may be performed that has a number of variations, which are next described.

With further reference to FIGS. 5A-5D, in accordance with embodiments of the present invention, the method further includes performing one of the following operations: (variation 1) driving the row line buffer, for example, programmable current-limited voltage buffer 130-1, at +V/2 subject to a current limit, $i_{HS}$+$i_{CL}$, for a fixed time period; (variation 2) driving the row line buffer, for example, programmable current-limited voltage buffer 130-1, at +V/2 until the current limit, $i_{HS}$+$i_{CL}$ is reached, as signaled on the OV output line, identified with the over-current output-signal line 130-1C; (variation 3) driving the row line buffer, for example, programmable current-limited voltage buffer 130-1, at +V/2 until the current limit , $i_{HS}$+$i_{CL}$, is reached, as signaled on the OV output line, identified with the over-current output-signal line 130-1C, or until a fixed time period has elapsed; and, (variation 4) driving the row line buffer, for example, programmable current-limited voltage buffer 130-1, at +V/2 for a fixed time period during which any OV indication is used by the selected column buffer, for example, the column-line buffer 150-1, as a signal to lessen the magnitude of its driven signal, initially at −V/2. In an embodiment of the present invention, the variation 1, which has the row line buffer driving +V/2, subject to the current limit, $i_{HS}$+$i_{CL}$, for a fixed time period, raises an issue, which is next described. Assume the current limit, $i_{HS}$+$i_{CL}$, is reached and the output voltage from the row-line buffer, for example, programmable current-limited voltage buffer 130-1, begins to lower. Then, the formerly half-selected devices will draw less current than their "allotment" in the total current limit budget of $i_{HS}$+$i_{CL}$. This condition would then permit the device being written, for example, the memory element 120-1, to draw more than $i_{CL}$; consequently, the written-device current limit has been exceeded even though the total row line current has been kept under limit. In other embodiments of the present invention, one method to circumvent this situation is to kill the write operation when the current limit is reached (as in variations 2 and 3). However, in accordance with embodiments of the present invention, some applications may provide that the device be written with the specified current for a fixed time period, as is described in variation 4. Variation 4 reacts to a row line over-current signal by lessening the column voltage, for example, on column line 160-1. Thus, in one embodiment of the present invention, variation 4 preserves the voltage across the half-selected same-row devices, and hence, the current through them, and so preserves the written-device current limit, $i_{CL}$.

Summarizing in light of the preceding discussion of FIGS. 5A-5D, referring once again to FIG. 2, in accordance with embodiments of the present invention, a detailed circuit implementation of the core functionality of the programmable current-limited voltage driver 130-1 is shown in FIG. 2. For clarity, only a single-ended (positive voltage only) implementation is shown in FIG. 2. The inventors have come to recognize that the circuit shown in FIG. 2 can be easily adapted in analog circuit design to negative-voltage, or dual-voltage-sense operation, as previously described. When the selected row line, for example, row line 140-1, is driven at +$V_{WRITE}$/2, with no current limit in effect, the row-line driver enable signal is asserted, while the current-limiting enable signal is still dormant. In this mode, a voltage is driven out on the row line, for example, row line 140-1, and a feedback circuit is used to ensure that this voltage is +$V_{WRITE}$/2. This feedback path involves the current-limit setting of the driver, which is thus set to exactly match the state-dependent current load of the row line's memory elements, for example, memristors, at the half-select voltage, +$V_{WRITE}$/2. When the current-limiting enable signal is then asserted, the control voltage that sets the current limit is effectively frozen by way of a sample-and-hold circuit 234-4. However, an additional current source is enabled that increases the current limit by a measured amount, for example, by the current-limited write current, $i_{CL}$; thus, embodiments of the present invention provide the current "headroom" for the selected device write operation, which is initiated by asserting the column-line driver enable. In accordance with an embodiment of the present invention, although FIG. 2 provides an example of the programmable current-limited voltage driver 130-1, another embodiment of the present invention based on switched capacitors is also possible, as previously described. For example, when the selected row line, for example, row line 140-1, is driven at +$V_{WRITE}$/2, with no current limit in effect, a switched capacitor may be used to measure the frequency of capacitor switching needed to maintain +$V_{WRITE}$/2 on the row line 140-1. This "half-select frequency" measurement is indicative of the row line current and could be held in a binary form. Then, when the column-line driver 150-1 is enabled and the full write operation is begun, a second capacitor-switching frequency is measured. If this second frequency is greater than the half-select frequency by more than a certain amount (reflecting the single-device write current), the programmable current-limited voltage driver 130-1 would be able to signal a current overload condition. Any of the invention method variations 1 through 4 described above could then be utilized.

Figure 6A:
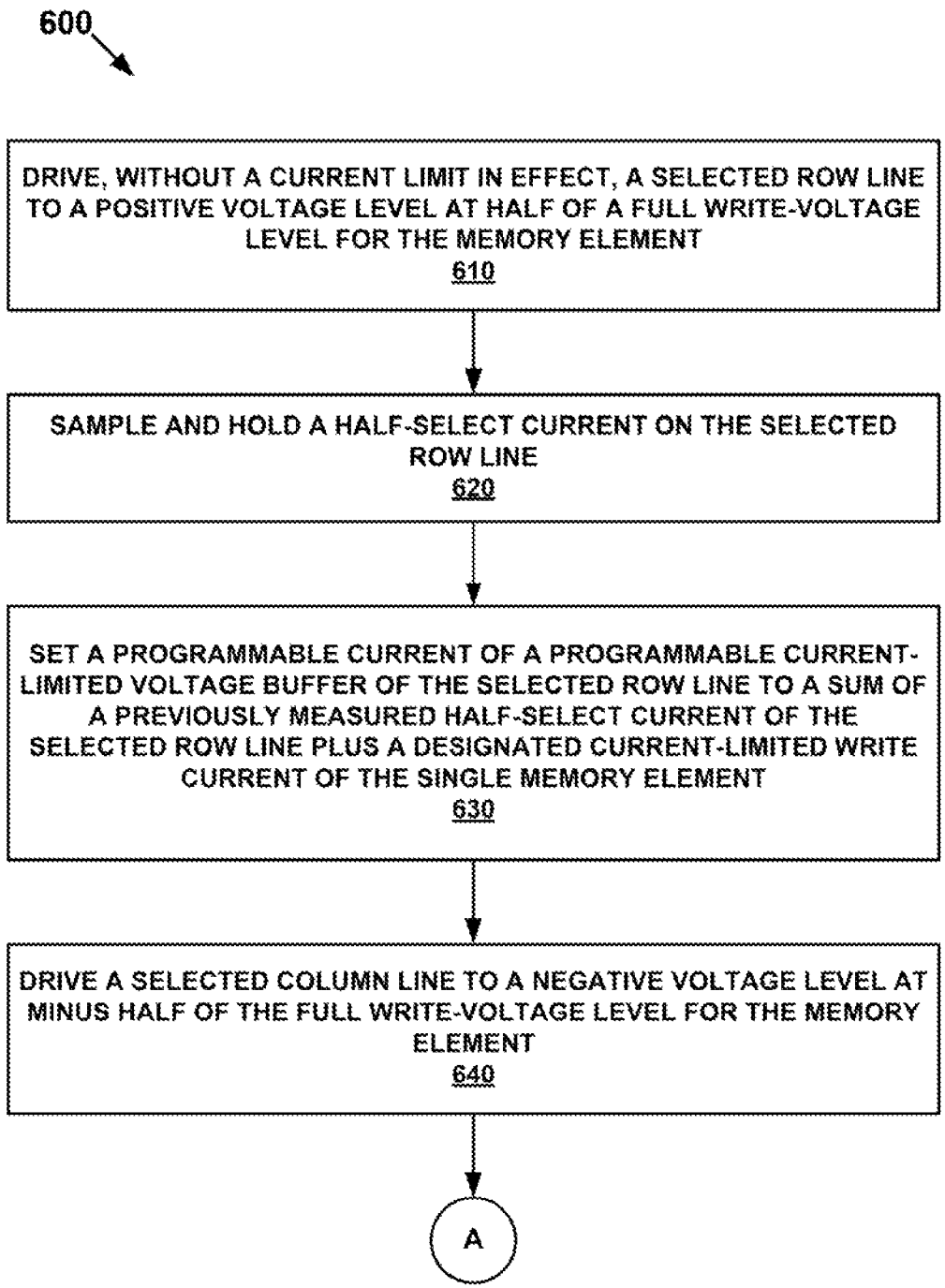
FIGS. 6A and 6B are a flowchart of a method for current limiting the memory element, for example, a memristor, during switching of the memory element in an array of memory elements, in accordance with an embodiment of the present invention.
Figure 6B:
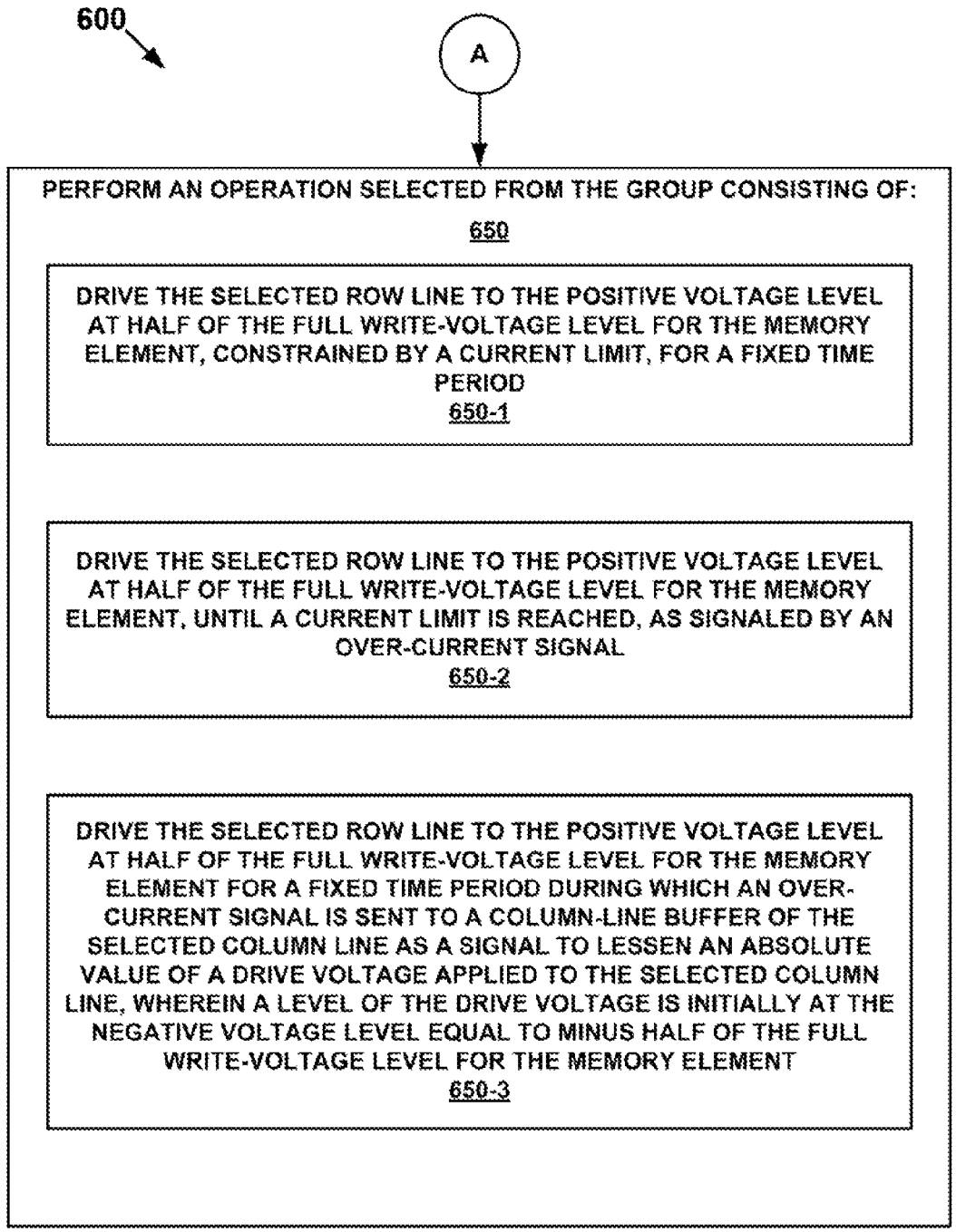

With reference now to FIGS. 6A and 6B, in accordance with an embodiment of the present invention, a flowchart 600 is shown of a method for current limiting a memory element during switching of the memory element in an array of memory elements. The method for current limiting the memory element during switching of the memory element in an array of memory elements includes the following. At 610, a selected row line 140-1 is driven to a positive voltage level at half of a full write-voltage level, $+V_{WRITE}/2$, for the memory element, without a current limit in effect. At 620, a half-select current, $i_{HS}$, is sampled and held on the selected row line. At 630, a programmable current of the programmable current-limited voltage buffer is set for the selected row line to a sum of a previously measured half-select current, $i_{HS}$, of the selected row line plus a designated safe current-limited write current, $i_{CL}$, for the single memory element. At 640, a selected column line is driven to a negative voltage level at minus half of the full write-voltage level, $-V_{WRITE}/2$, for the memory element. At 650, an operation is performed selected from the group of consisting of: 650-1, driving the selected row line to the positive voltage level at half of the full write-voltage level, $+V_{WRITE}/2$, for the memory element, constrained by a current limit, $i_{HS}$ for a fixed time period; 650-2, driving the selected row line to the positive voltage level at half of the full write-voltage level, $+V_{WRITE}/2$, for the memory element, until a current limit is reached, as signaled by an over-current signal; 650-3, driving the selected row line to the positive voltage level at half of the full write-voltage level, $+V_{WRITE}/2$, for the memory element for a fixed time period during which an over-current signal is sent to a column-line buffer of the selected column line as a signal to lessen an absolute value of a drive voltage applied to the selected column line, wherein a level of the drive voltage is initially at the negative voltage level equal to minus half of the full write-voltage level, $-V_{WRITE}/2$, for the memory element.

The foregoing descriptions of specific embodiments of the present invention have been presented for purposes of illustration and description. They are not intended to be exhaustive or to limit the technology to the precise forms disclosed, and many modifications and variations are possible in light of the above teaching. The embodiments described herein were chosen and described in order to best explain the principles of the technology and its practical application, to thereby enable others skilled in the art to best utilize the technology and various embodiments with various modifications as are suited to the particular use contemplated. It may be intended that the scope of the technology be defined by the claims appended hereto and their equivalents.

What is claimed is:

1. A programmable current-limited voltage buffer, comprising:
    at least one current-bias circuit, said current-bias circuit coupled to a first rail of a power supply;
    an inverter, said inverter coupled to said current-bias circuit and to a reference-voltage source, and said inverter configured to couple a row line, coupled to at least one memory element, to at least one of said current-bias circuit and said reference-voltage source in response to an input signal applied to said inverter;
    at least one write-current set control circuit; and
    at least one adaptive current limiter, said adaptive current limiter coupled to said current-bias circuit and coupled to said write-current set control circuit, said adaptive current limiter configured to limit current flowing through said memory element in a write operation of said memory element.

2. The programmable current-limited voltage buffer of claim 1, further comprising:
    a row-line over-current detection circuit, said row-line over-current detection circuit configured to output an over-current signal if an integrated row line power output from said inverter exceeds a threshold value that is at a safe margin below a value at which irreversible damage may occur in said memory element.

3. The programmable current-limited voltage buffer of claim 1, wherein said write-current set control circuit comprises an operational amplifier, said operational amplifier configured to compare an output voltage of said row line against a write voltage reference level, and configured to set a current sourced to said row line from said current-bias circuit to at least a half-select current level of said row line.

4. The programmable current-limited voltage buffer of claim 1, wherein said current-bias circuit comprises a current mirror.

5. The programmable current-limited voltage buffer of claim 1, wherein said adaptive current limiter comprises a current-limiting element selected from the group consisting of a current-limiting resistor of fixed value, a potentiometer, an adaptive resistance, and a switched-capacitor.

6. The programmable current-limited voltage buffer of claim 5, wherein said switched-capacitor is configured to limit a current from said current-bias circuit to a half-select current level for said row line in response to a first clock frequency, and to limit a current from said current-bias circuit to a sum of said half-select current level for said row line plus a current-limited write current in response to a second clock frequency to write said memory element.

7. The programmable current-limited voltage buffer of claim 1, wherein said adaptive current limiter comprises:
    a current-limiting element, a first terminal of said current-limiting element coupled to a first node on one lead of said current-bias circuit;
    a write-current limiter coupled to said first node; and
    a sample-and-hold circuit coupled to a control node, said control node coupled to a second terminal of said current-limiting element;
    wherein said adaptive current limiter is configured to sum a half-select current level for said row line plus a current-limited write current, and to limit a row-line current provided by said current-bias circuit to said row line to a sum of said half-select current level for said row line plus said current-limited write current to write said memory element with no more than said current-limited write current passing through said memory element.

8. The programmable current-limited voltage buffer of claim 7, wherein said write-current limiter comprises:
    a second current-bias circuit; and
    a second current-limiting element, said second current-limiting element coupled to said second current-bias circuit and coupled to said first rail of said power supply, said current limiter configured to limit a portion of current drawn by said second current-bias circuit from said first node of said adaptive current limiter to said current-limited write current provided by said current-bias circuit to said memory element written on said row line.

9. The programmable current-limited voltage buffer of claim 8, wherein said second current-limiting element comprises a circuit element selected from the group consisting of a current-limiting resistor of fixed value for setting a current-limited write current for binary digital logic, and a potentiometer of selectable resistance for setting a current-limited write current of various levels for multilevel logic.

10. The programmable current-limited voltage buffer of claim 8, wherein said second current-bias circuit comprises a second current mirror.

11. An integrated-circuit device, comprising:
at least one memory element; and
at least one programmable current-limited voltage buffer, comprising:
at least one current-bias circuit, said current-bias circuit coupled to a first rail of a power supply;
an inverter, said inverter coupled to said current-bias circuit and to a reference-voltage source, and said inverter configured to couple a row line, coupled to at least one memory element, to at least one of said current-bias circuit and said reference-voltage source in response to an input signal applied to said inverter;
at least one write-current set control circuit; and
at least one adaptive current limiter, said adaptive current limiter coupled to said current-bias circuit and coupled to said write-current set control circuit, said adaptive current limiter configured to limit current flowing through said memory element in a write operation of said memory element; and
a row-line over-current detection circuit, said row-line over-current detection circuit configured to output an over-current signal if an integrated row line power output from said inverter exceeds a threshold value that is at a safe margin below a value at which irreversible damage may occur in said memory element; and
a column-line buffer, said column-line buffer configured to apply a column-line voltage to said memory element sufficient to draw a current from said current-bias circuit sufficient to write said memory element; and
wherein said adaptive current limiter is configured to limit said current flowing through said memory element upon writing said memory element to a value that is a safe margin below an over-current value at which irreversible damage may occur in said memory element.

12. The integrated-circuit device of claim 11, further comprising:
complementary-metal-oxide-semiconductor (CMOS) silicon integrated circuitry;
an array of memory elements selected from the group consisting of a logic array, and a memory array; and
wherein said array of memory elements is configured for a mode of computing selected from the group consisting of binary digital computing, and multilevel logic.

13. The integrated-circuit device of claim 11, wherein said memory element is a memristor.

14. A method for current limiting a memory element during switching of said memory element in an array of memory elements, said method comprising:
driving, without a current limit in effect, a selected row line to a positive voltage level at half of a full write-voltage level for said memory element;
sampling and holding a half-select current on said selected row line;
setting a programmable current from a programmable current-limited voltage buffer of said selected row line to a sum of a previously measured half-select current of said selected row line plus a designated safe current-limited write current for said single memory element;
driving a selected column line to a negative voltage level at minus half of said full write-voltage level for said memory element.

15. The method of claim 14, said method further comprising:
performing an operation selected from the group of consisting of:
driving said selected row line to said positive voltage level at half of said full write-voltage level for said memory element, constrained by a current limit, for a fixed time period;
driving said selected row line to said positive voltage level at half of said full write-voltage level for said memory element, until a current limit is reached, as signaled by an over-current signal;
driving said selected row line to said positive voltage level at half of said full write-voltage level for said memory element for a fixed time period during which an over-current signal is sent to a column-line buffer of said selected column line as a signal to lessen an absolute value of a drive voltage applied to said selected column line, wherein a level of said drive voltage is initially at said negative voltage level equal to minus half of said full write-voltage level for said memory element.

* * * * *